SEMICONDUCTOR-METAL-SEMICONDUCTOR STRUCTURE

Filed Dec. 9, 1963

INVENTORS
VICTOR J. SILVESTRI
VINCENT J. LYONS
JOHN C. MARINACE

BY John F. Ahlandt Jr.

ATTORNEY 3,386,864
SEMICONDUCTOR-METAL-SEMICONDUCTOR STRUCTURE

Victor J. Silvestri, Mount Kisco, Vincent J. Lyons, Poughkeepsie, and John C. Marinace, Yorktown Heights, N.Y., assignors to International Business Machines Corporation, New York, N.Y., a corporation of New York Filed Dec. 9, 1963, Ser. No. 329,079
6 Claims. (Cl. 148—175)

ABSTRACT OF THE DISCLOSURE

A thin metallic layer interconnecting corresponding portions of several active circuit elements is defined beneath the surface of a high resistivity crystalline semiconductor substrate, or wafer. Initially, a plurality of spaced trenches are etched in the substrate surface, and the substrate surface including such trenches is plated with a thin metallic layer which is discontinuous on a microscopic scale. Semiconductor material is vapor deposited over the metallic layer which nucleates with the substrate material along discontinuities in the metallic layer to form an epitaxial deposit having a same periodicity and orientation as the substrate material. The semiconductor wafer is lapped and polished to remove the epitaxial deposit and the metallic layer from over the substrate surface whereby only the metallic layer and epitaxial deposit in the spaced trenches remains. Active circuit elements are formed in the remaining epitaxial deposit by typical techniques, e.g., diffusion, alloying, etc., whereby corresponding portions thereof are connected along the recessed metallic layer.

This invention relates to the formation of semiconductor bodies and, more particularly, to a vapor growth technique for forming semiconductor bodies which are useful in fabricating signal translating devices.

Vapor growth is a general designation for a technique of growing semiconductor materials from the vapor phase onto a substrate so as to create an epitaxial extension of the substrate. The term epitaxial as used in the semiconductor art refers to the fact that the depositing material retains the same periodicity and orientation as the substrate.

One particular form of vapor growth which has been developed and has found wide application is a technique which involves a halide reaction wherein the transport element, a halogen, is caused to combine in a first temperature zone of a reaction container with a source of semiconductor material at a prescribed temperature. Following the initial reaction in the first zone, there is movement of the products of the reaction to another temperature zone in which decomposition occurs and the semiconductor material forms an epitaxial growth region on a substrate situated in the latter zone.

The vapor growth technique described above has been employed with a variety of semiconductor materials, both elemental and those of compound form, such as the III–V compounds. One of these III–V compounds, GaAs, has such properties, notably its high resistivity when intrinsic, that it lends itself to use as a matrix in integrated circuit fabrication.

When the vapor growth technique referred to above is directed to the formation of integrated circuits, wherein active semiconductor elements are embedded in or otherwise formed on a substrate of semiconductor material, a number of difficulties are presented. It is usually desirable to connect together with a low resistance conductor the corresponding portions of the several active elements or components that are disposed in an array. To accomplish this by a subsequent vacuum evaporation of conductive material serving as the connection between elements is far from a satisfactory approach since it involves masking of the substrate. In the first place, precise registration of the mask is necessary; secondly, it is wasteful of space because a considerable part of the area of the conductor has to be added to the area of the individual component; and thirdly, an essentially edge-to-edge contact is made having a relatively high resistance, which is a very undesirable feature.

What has been discovered, thus constituting the basic concept of the present invention, is that, by suitably choosing a conductive material and initially depositing a thin film of this conductive material onto the surface of the substrate, epitaxial growth of semiconductor material can be produced over the conductive film by virtue of nucleation at very small holes occurring fortuitously, or deliberately created, in the conductive film. Such a conductive film can then function as a "bus bar," linking together the first-formed epitaxially grown portions of the active elements that are to be realized in the matrix. It has been found that a number of materials are suitable as the conductive film which covers the matrix. Specific examples of materials that have been found to be advantageous are carbon and rhodium, but it will be appreciated that other materials may be used for this conductive film, which is incorporated in the various structural configurations of the present invention, as long as these materials have the following essential attributes: (1) that they will not be affected by the vapor growth process, that is, they are not particularly susceptible to attack by the halides present in the system, and (2) that they may be easily applied to the substrate.

It is, therefore, a primary object of the present invention to incorporate a conductive film in the formation of discrete devices in an integrated assembly such that the conductive film will facilitate connections between the devices.

The foregoing and other objects, features and advantages of the invention will be apparent from the following more particular description of preferred embodiments of the invention, as illustrated in the accompanying drawings.

Figure 1:
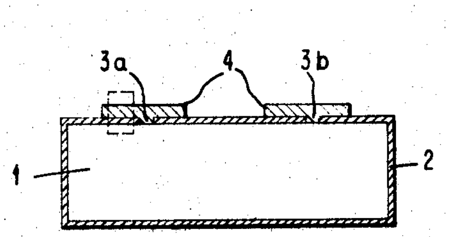
FIGURE 1 is a simple configuration which illustrates the basic principles of the present invention.

Referring now to FIGURE 1, there is shown a simple configuration illustrative of the principles of the present invention. A crystalline substrate 1, for example, of germanium, is shown with a layer 2 deposited on its entire surface. On the top surface of the substrate 1 a plurality of apertures *3a* and *3b* are shown in the layer 2. Semiconductor material 4, for example, of germanium, is shown within these apertures and situated also on top of the layer 2. The growth of the material 4 is an epitaxial one by virtue of the fact that nucleation has occurred within the apertures *3a* and *3b* and the atoms of the deposited semiconductor material have followed the precise orientation of the substrate 1 both within the apertures *3a* and *3b* and atop the surface of the layer 2.

The layer 2 which serves as the conductive film, selected, for example, to be of carbon, is deposited on the substrate by cracking propane at a temperature of approximately 750° C. over the substrate 1 of germanium which has been cut in a {111} crystallographic orientation. The several apertures *3a* and *3b* having been made through the carbon layer 2 in order to expose the substrate 1, the substrate is placed in a quartz tube with germanium semiconductor material and with $I_2$ as the transport element. The tube or container is sealed under vacuum for the vapor growth run. The temperature used in the region where the substrate is located is on the order of 600° C. and the process is continued for one hour. For further details of this particular vapor growth technique, reference may be made to the article entitled "Epitaxial Vapor Growth of Ge Single Crystals in a Closed-Cycle Process" by J. C. Marinace, IBM Journal of Research and Development, July 1960, pp. 248–255.

Following the procedures outlined above, in a typical run, a deposit of germanium was formed in the apertures created in the carbon layer and the deposit of germanium was found to be epitaxial by means of microscopic examination. The examination of an end view of the epitaxial growth which had occurred revealed that along with the growth perpendicular to the substrate 1 there was lateral growth over the carbon layer, thus incorporating the carbon layer between similarly oriented germanium layers. It will be appreciated, therefore, referring to FIGURE 1, the section enclosed by the dashed lines is essentially a sandwich-type structure consisting of a semiconductor layer of selected conductivity type followed by a thin conductive layer of the deposited carbon and another semi-conductor layer of selected type on top of the carbon layer, deposited as described. It should be noted that although reference has been made above to specific materials, any semiconductor material which can be grown through a vapor phase reaction may be used in combination with the incorporation of the conductive film.

Having described a simple configuration that gives a clear picture of the basic concept of the present invention, consideration is now turned to the particular formation of an assembly of discrete devices where the aforesaid concepts will be specifically applied.

Figure 3:
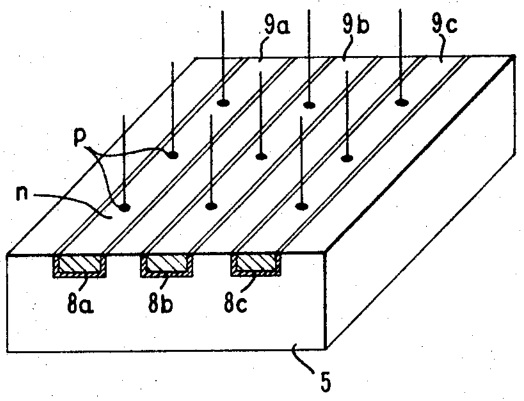
FIGURE 3 is a cross sectional perspective view of a completed device array.
Figure 2A:
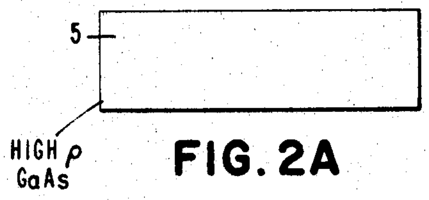
FIGURES 2A–2E are cross sectional views illustrating the various steps employed in the fabrication of a device array.
Figure 2B:
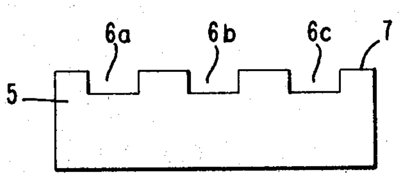
Figure 2C:
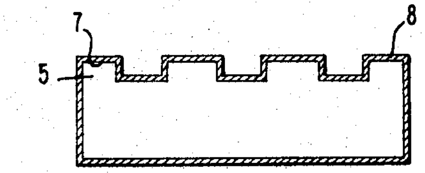

Referring now to FIGURES 2A–2E, there are illustrated the steps to be followed in obtaining the device array depicted in FIGURE 3. As shown in FIGURE 2A, a high resistivity substrate or wafer 5 of GaAs is initially provided. This wafer of GaAs has a resistivity in the order of 5 megohms which makes it ideal for serving as the matrix or support of the device array, since with such a high resistivity the GaAs substrate acts as an insulator. Typically, the wafer 5 would have an area of approximately 2 cm.$^2$ and a thickness of approximately 2 mm. As shown in cross section in FIGURE 2B, a number of trenches 6*a*, 6*b* and 6*c* have been cut into the top surface 7 of the substrate 5. The trenches 6*a*, 6*b* and 6*c* have dimensions on the order of .6 m. wide and .5 mm. deep. The substrate is etched and then plated with a layer 8 of rhodium to an estimated thickness of 1 micron as shown in FIGURE 2C. Such plating is not completely continuous on a microscopic scale, that is, minute holes exist in such films and it is in these minute holes that nucleation takes place with the aforementioned result of epitaxial growth on top of the conductive layer, in this case layer 8 of rhodium. Rhodium, of course, meets the criteria previously established that the conductive film be of a metal that is not affected by the vapor growth process and is readily applied. Rhodium is very easily electrolytically plated onto a semiconductor substrate, such as the aforesaid GaAs substrate 5.

Figure 2D:
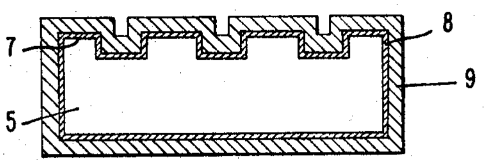
Figure 2E:
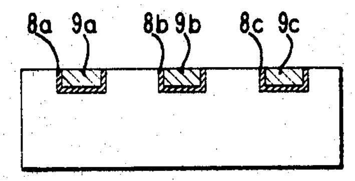

After the rhodium plating 8 has been made in the trenches 6*a*, 6*b* and 6*c* and on the remainder of the surface, the entire assembly is then placed in a sealed tube reaction apparatus for the deposition of germanium onto the assembly. The germanium is deposited following the Ge-$I_2$ disproportionation reaction until the trenches are ¾ full of epitaxial germanium growth, as shown in FIGURE 2D. Typically, the germanium would be of n conductivity type. Then the surfaces are lapped and polished until only the germanium growth in the trenches remains. This is illustrated in FIGURE 2E.

The result of epitaxial growth following the above-described procedure can also be appreciated by referring to FIGURE 3, which shows a device array in perspective. The same substrate 5 is shown as was depicted in FIGURE 2 having the three strips of germanium 9*a*, 9*b* and 9*c* epitaxially deposited upon the high resistivity GaAs. Because of the underlying metal layers which have been incorporated in the structure, there is a very low resistance between any two points on a given strip but, of course, there is an extremely high resistance between the strips.

Devices are finally realized on the structure of FIGURE 3 by using typical techniques, such as, vapor growth, diffusion or alloying, to produce the devices in discrete areas. As an example, there is shown in FIGURE 3 the situation where alloying has been performed upon the top surface, as shown by the alloy dots 10*a*, 10*b* and 10*c*, so as to form abrupt junction devices. Since the strips 9*a*, 9*b* and 9*c* were chosen to be of n conductivity type the alloy dots are selected to contain p conductivity type material, pn junctions will be formed by the alloying operation in discrete areas of the strips.

Although a simple device array has been shown in FIGURE 3, it will be understood that more complicated arrays may be obtained. In particular, a coordinate array may be fabricated by forming the epitaxial growth strips in trenches in both the $x$ and $y$ directions on the top surface of the matrix.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A process of fabricating an assembly of semiconductor devices interconnected along a thin conductive layer beneath the surface of a high resistivity substrate comprising the steps of, forming a plurality of discretely spaced trenches in a high resistivity monocrystalline semiconductor substrate, plating the surface of said substrate at least including said trenches with a thin conductive layer having apertures therein through which said substrate is exposed, depositing semiconductor material at least over said conductive layer within said trenches which nucleates epitaxially on the exposed portions of said substrate to form a continuous epitaxial layer having a same orientation as said substrate and within said trenches, removing said epitaxially deposited semiconductor material and said conductive layer from the surface of said substrate except portions remaining in said trenches, and forming spaced semiconductor devices in said epitaxially deposited semiconductor material present in said trenches.

2. A process as defined in claim 1 wherein said epitaxially deposited semiconductor material is of first conductivity type and said devices are formed in said epitaxially deposited semiconductor material by alloying dots of material containing opposite conductivity-type impurities.

3. A process of fabricating an assembly of semiconductor devices interconnected along a thin layer of metal beneath the surface of a high resistivity substrate comprising the steps of, forming a plurality of discretely spaced trenches in a high resistivity monocrystalline semiconductor substrate, plating on the entire surface of said substrate including said trenches with a thin layer of metal having apertures therein through which said substrate is exposed, depositing semiconductor material at least over said layer of metal within said trenches, which nucleates epitaxially on the exposed portions of said substrate to form a continuous epitaxial layer having a same orientation as said substrate, removing all of said epitaxially deposited semiconductor material and said layer of metal from the surface of said substrate except portions remaining in said trenches, and forming spaced semiconductor devices in the layers of epitaxially deposited semiconductor material present in said trenches.

4. A process as defined in claim 3 wherein said epitaxially deposited semiconductor material is of first conductivity type and said devices are formed in said epitaxially deposited semiconductor material by alloying dots of material containing opposite conductivity-type impurities.

5. A process of fabricating an assembly of semiconductor devices interconnected along a layer of rhodium beneath the surface of a high resistivity substrate comprising the steps of, forming a plurality of discretely spaced trenches in a high resistivity semiconductor substrate, first, plating the entire surface of said substrate including said trenches with a layer of rhodium having a thickness on the order of 1 micron and having apertures therein through which said substrate is exposed, depositing semiconductor material at least over said layer of rhodium within said trenches which nucleates epitaxially on the exposed portions of said substrate to form a continuous epitaxial layer having a same orientation as said substrate, removing all of said epitaxially deposited semiconductor material and said layer of rhodium from said substrate except portions remaining in said trenches, and forming spaced semiconductor devices in said epitaxially deposited semiconductor material present in said trenches.

6. A process as defined in claim 4 wherein said epitaxially deposited semiconductor material is of first conductivity type and said semiconductor devices are formed in said epitaxially deposited semiconductor material by alloying dots of material containing opposite conductivity-type impurities.

References Cited

UNITED STATES PATENTS

| | | | |
|---|---|---|---|
| 2,842,463 | 7/1958 | Bond et al. | 117—107 |
| 2,882,377 | 4/1959 | Rinehart | 117—107 |
| 2,984,589 | 5/1961 | Feldman | 117—107 |
| 3,039,896 | 6/1962 | Cakenberghe et al. | 117—107 |
| 3,094,650 | 6/1963 | Riegert | 117—107 |
| 2,854,366 | 9/1958 | Wannlund et al. | 148—33.2 |
| 3,083,441 | 4/1963 | Little et al. | 148—33.2 |
| 3,234,058 | 2/1966 | Marinace | 148—175 |
| 3,250,966 | 5/1966 | Rose | 148—175 |

OTHER REFERENCES

Van Ligten, IBM Technical Disclosure Bulletin, vol. 4, No. 10, March 1962, pp. 58–59.

Marinace, IBM Technical Disclosure Bulletin, vol. 3, No. 8, January 1961, pp. 29–30.

HYLAND BIZOT, *Primary Examiner.*

N. MARKVA, P. WEINSTEIN, *Assistant Examiners.*